(12) United States Patent
Yang et al.

(10) Patent No.: US 7,276,796 B1
(45) Date of Patent: Oct. 2, 2007

(54) FORMATION OF OXIDATION-RESISTANT SEED LAYER FOR INTERCONNECT APPLICATIONS

(75) Inventors: Chih-Chao Yang, Poughkeepsie, NY (US); Nancy R. Klymko, Hopewell Junction, NY (US); Christopher C. Parks, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/308,284

(22) Filed: Mar. 15, 2006

(51) Int. Cl.
*H01L 23/48* (2006.01)
(52) U.S. Cl. .................. 257/751; 257/486; 257/740; 257/767; 257/E21.006; 257/E23.162; 438/570; 438/580
(58) Field of Classification Search .............. None
See application file for complete search history.

(56) References Cited

U.S. PATENT DOCUMENTS

| | | | |
|---|---|---|---|
| 5,486,282 A | 1/1996 | Datta et al. | |
| 6,432,821 B1 | 8/2002 | Dubin et al. | |
| 6,881,318 B2 | 4/2005 | Hey et al. | |
| 2004/0084773 A1* | 5/2004 | Johnston et al. | 257/751 |

* cited by examiner

*Primary Examiner*—Evan Pert
*Assistant Examiner*—Scott R. Wilson
(74) *Attorney, Agent, or Firm*—Scully, Scott, Murphy & Presser, P.C.; Lisa Jaklitsch, Esq.

(57) ABSTRACT

An interconnect structure of the single or dual damascene type and a method of forming the same, which substantially reduces the surface oxidation problem of plating a conductive material onto a noble metal seed layer are provided. In accordance with the present invention, a hydrogen plasma treatment is used to treat a noble metal seed layer such that the treated noble metal seed layer is highly resistant to surface oxidation. The inventive oxidation-resistant noble metal seed layer has a low C content and/or a low nitrogen content.

15 Claims, 4 Drawing Sheets

FORMATION OF OXIDATION-RESISTANT SEED LAYER FOR INTERCONNECT APPLICATIONS

FIELD OF THE INVENTION

The present invention relates to a semiconductor structure and a method of fabricating the same. More particularly, the present invention relates to an interconnect structure of the single or dual damascene type in which an oxidation-resistant noble metal seed layer is employed. The present invention also relates to a method of fabricating such a semiconductor structure.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

In current technologies, physical vapor deposited (PVD) Ta(N) and PVD Cu seed layers are used as a Cu diffusion barrier and plating seed, respectively, for advanced interconnect applications. However, with decreasing critical dimension CD, it is expected that PVD based deposition techniques will run into conformality and step coverage issues. These, in turn, will lead to fill issues at plating such as, for example, center and edge voids, which cause reliability concerns and yield degradation. One way to avoid this potential issue is to reduce the overall thickness of PVD deposited material, and utilizes a single layer of liner material as both the diffusion barrier and the plating seed layer.

Another way to avoid this potential issue is the use of chemical vapor deposition (CVD) or atomic layer deposition (ALD) technologies which results in better step coverage and conformality than the one from a PVD deposition process. CVD/ALD deposited Ru and Ir have the potential of replacing current PVD based barrier/plating seed layers for advanced interconnect applications.

However, an issue that exists for the direct plating of Cu on Ru (or another like noble metal, i.e., a metal from Group VIIIA of the Periodic Table of Elements) is the tendency of the surface to oxidize on exposure to air which results in an increased electrical conductivity, possibly a decrease in the uniformity of the electrical conductivity across a wafer, and possibly adhesion. The noble metal surface oxidation leads to problems in subsequent Cu electroplating process. Apart from the extremely poor fill of patterned structures, insufficient adhesion of Cu to a surface oxide poses electromigration and stress reliability concerns. Known solutions involve the use of processes such as forming gas annealing to reduce the surface oxide before plating. Drawbacks of these prior art techniques include, for example: 1) a time window (Q time) exists within which reduced wafers have to be plated before the surface oxide grows again, and 2) increased manufacturing cost due to require tooling for the reducing process, and increased raw process time.

U.S. Pat. Nos. 5,486,262 to Datta et al., 6,432,821 to Dubin et al., and 6,881,318 to Hey et al. are some prior art examples describing the direct plating of Cu onto a noble metal. Although such examples of direct plating exist, these prior art direct plating processes also suffer the above mentioned surface oxidation problem.

In view of the surface oxidation problem mentioned above for prior art direct plating methods, there is a continued need to provide a direct plating method that can be used for fabricating interconnect structures where the surface oxidation of the noble metal seed layer has been substantially reduced and/or eliminated.

SUMMARY OF THE INVENTION

The present invention provides an interconnect structure of the single or dual damascene type and a method of forming the same, which substantially reduces or eliminates the surface oxidation problem that is exhibited by prior art interconnect structures where a noble metal seed layer has been employed. In accordance with the present invention, this objective is achieved by utilizing a hydrogen plasma treatment process which is performed on the surface of the noble metal seed layer prior to deposition of Cu or another like interconnect conductive material. The method of the present invention can reduce the surface carbon of the noble metal seed layer to about 2 atomic percent or less, similarly, the surface nitrogen content is about 3 atomic percent or less. Also, the surface concentration of oxygen is less than about 3 atomic percent.

It is noted that the method of the present invention significantly reduces the surface carbon content in the noble metal seed layer. It is also noted that many CVD and ALD processes will not give a very pure metal. The residual carbonaceous material on the surface is prone to be oxidized and chemically change upon exposure to the atmosphere, which as a result will make the noble metal seed layer have a very different surface chemistry, such as direct palatability.

In broad terms, the invention provides a semiconductor structure comprising a film stack including an oxidation-resistant noble metal seed layer sandwiched between a substrate and a conductive metal-containing material.

In more specific terms, an interconnect structure is provided that comprises: a dielectric material including at least one opening therein; a diffusion barrier located within said at least one opening; an oxidation-resistant noble metal seed layer located on said diffusion barrier; and an interconnect conductive material located within the at least one opening.

The present invention contemplates closed-via bottom structures, open-via bottom structures and anchored-via bottom structures.

In a preferred embodiment of the present invention, a Cu interconnect structure is provided that includes: a dielectric material including at least one opening therein; a diffusion barrier located within said at least one opening; an oxidation-resistant noble metal seed layer located on said diffusion barrier; and a Cu interconnect metal located within the at least one opening.

In addition to providing the aforementioned interconnect structures, the present invention also provides a method of fabricating the same. In general terms, the method of the present invention includes: forming at least one opening in a dielectric material; forming a diffusion barrier on exposed wall portions of said dielectric material within said at least one opening; forming an oxidation-resistant seed layer on said diffusion barrier; and forming an interconnect conductive material within said at least one opening.

In broader terms, the present invention provides a method that includes forming a noble metal seed layer on a surface of a substrate; treating said noble metal seed layer in a hydrogen plasma to provide an oxidation-resistant noble metal seed layer; and forming a conductive material on said oxidation-resistant noble metal seed layer.

BRIEF DESCRIPTION OF THE DRAWINGS

FIG. 6A includes an interconnect structure with an open-via bottom structure, while FIG. 6B includes an interconnect structure with an anchored-via bottom structure.

DETAILED DESCRIPTION OF THE PRESENT INVENTION

The present invention, which provides an interconnect structure including an oxidation-resistant noble metal seed layer and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

Figure 1:
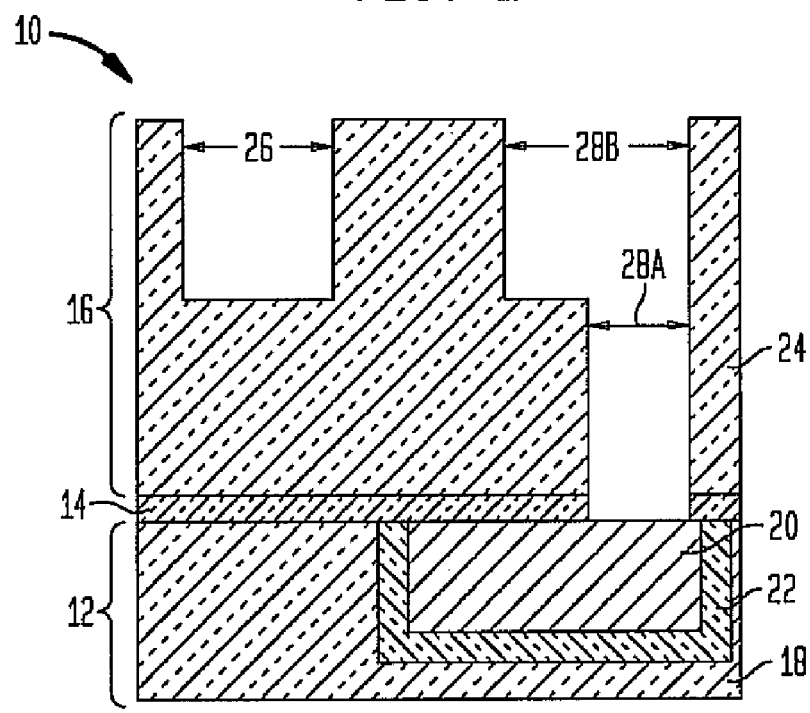
FIG. 1 is a pictorial representation (through a cross sectional view) illustrating an interconnect structure through initial stages of the inventive method wherein at least one opening is provided in a dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are separated in part by dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. In FIG. 1, two openings are shown; reference number 26 denotes a line opening for a single damascene structure, and reference numeral 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conductive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 22 may vary depending on the exact means of the deposition process as well as the material employed. Typically, the barrier layer 22 has a thickness from about 4 to about 40 nm, with a thickness from about 7 to about 20 nm being more typical.

Following the barrier layer 22 formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer 22 and the conductive feature 20 each have an upper surface that is substantially coplanar with the upper surface of the first dielectric material 18.

Although not specifically illustrated, the inventive method described herein below (including noble metal seed layer deposition followed by a $H_2$ plasma process) can be used to provide the conductive feature 20, which includes an oxidation-resistant noble metal seed layer between the conductive feature 20 and the barrier layer 22. In such an embodiment, polysilicon is not used as the conductive material.

After forming the at least one conductive feature 20, the dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In FIG. 1, two openings are shown; reference number 26 denotes a line opening for a single damascene structure, and reference numeral 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 14 that is located atop the conductive feature 20 in order to make electrical contact between interconnect level 12 and level 16.

Next, a diffusion barrier 30 having Cu diffusion barrier properties is provided by forming the diffusion barrier 30 on exposed surfaces (including wall surfaces within the opening) on the second dielectric material 24. The resultant structure is shown, for example, in FIG. 2. The diffusion barrier 30 comprises a same or different material as that of barrier layer 22. Thus, diffusion barrier 30 may comprise Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 30 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 30 may vary depending on the number of material layers within the barrier, the technique used in forming the same as well as the material of the diffusion barrier itself. Typically, the diffusion barrier 30 has a thickness from about 4 to about 40 nm, with a thickness from about 7 to about 20 nm being even more typical.

Figure 2:
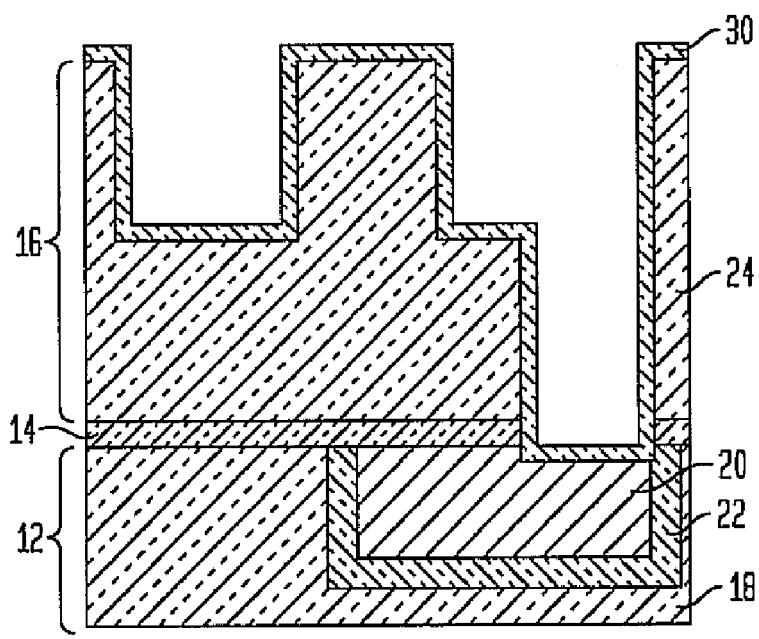
FIG. 2 is a pictorial representation (through a cross sectional view) illustrating the interconnect structure of FIG. 1 after formation of a diffusion barrier inside the at least the one opening.
Figure 3:
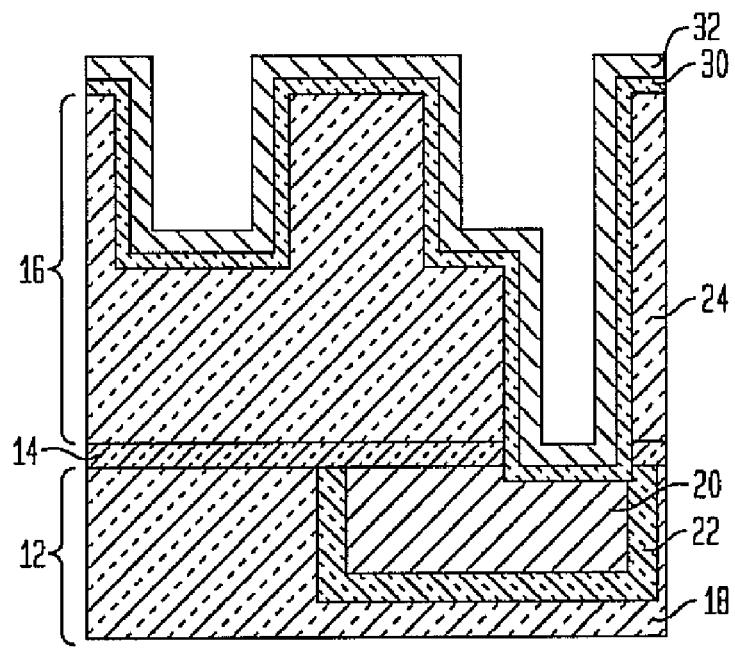
FIG. 3 is a pictorial representation (through a cross sectional view) illustrating the interconnect structure of FIG. 2 after formation of a noble metal seed layer.

FIG. 3 shows the structure of FIG. 2 after formation of noble metal seed layer 32 atop the diffusion barrier 30. The noble metal seed layer 32 is comprised of a metal or metal alloy from Group VIIIA of the Periodic Table of Elements. Examples of suitable Group VIIIA elements for the noble metal seed layer include, but are not limited to: Ru, Ir, Rh, Pt, Pd and alloys thereof. In some embodiments, it is preferred to use Ru, Ir or Rh as the noble metal seed layer 32.

The noble metal seed layer 32 is formed by a conventional deposition process including, for example, chemical vapor deposition (CVD), plasma enhanced chemical vapor deposition (PECVD), atomic layer deposition (ALD), plating, sputtering and physical vapor deposition (PVP). The thickness of the noble metal seed layer 32 may vary depending on number of factors including, for example, the compositional material of the noble metal seed layer 32 and the technique that was used in forming the same. Typically, the noble metal seed layer 32 has a thickness from about 0.5 to about 10 nm, with a thickness of less than 6 nm being even more typical.

Figure 4:
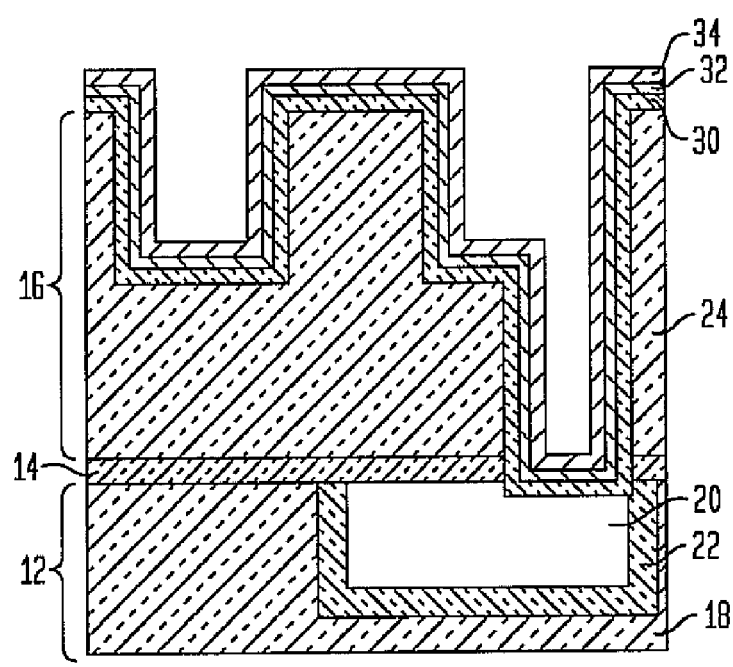
FIG. 4 is a pictorial representation (through a cross sectional view) illustrating the interconnect structure of FIG. 3 after subjecting said noble metal seed layer to a hydrogen plasma treatment process.

FIG. 4 shows the resultant structure formed after subjecting the noble metal seed layer 32 to a hydrogen ($H_2$) plasma treatment process, which forms an oxidation-resistant noble metal seed surface region 34 on layer 32. It is noted that the noble metal seed layer 32 together with the oxidation-resistant noble metal seed surface region 34 form the inventive oxidation-resistant noble metal seed layer. The $H_2$ plasma process includes providing a plasma of hydrogen, $H_2$, using a hydrogen source such as, for example, molecular or, more preferably, atomic hydrogen. The hydrogen plasma is a neutral, highly ionized hydrogen gas that consists of neutral atoms or molecules, positive ions and free electrons. Ionization of the hydrogen source is typically carried out in a reactor chamber in which the ionization process is achieved by subjecting the source to strong DC or AC electromagnetic fields. Alternatively, the ionization of the hydrogen source is performed by bombarding the gate atoms with an appropriate electron source. In accordance with a preferred embodiment of the present invention, the hydrogen plasma process used to provide the oxidation-resistant noble metal seed surface region 34 is performed at a temperature of from about 20° to about 200°. Other temperatures can also be used as long as the temperature of the $H_2$ plasma process provides an oxidation-resistant noble metal seed surface region 34.

The term "oxidation-resistant noble metal seed layer" is used throughout the present application to denote a seed layer that contains a noble metal or an alloy of a noble metal wherein a surface oxide does not form thereon during subsequent expose to air. It is again emphasized that surface region 34 and layer 32 form the inventive oxidation-resistant noble metal seed layer. As compared to a conventional noble metal surface without receiving the claimed method for surface treatment, the present invention can reduce the surface carbon of the noble metal to about 2 atomic percent or less, similarly, the surface nitrogen content is about 3 atomic percent or less. Also, the surface concentration of oxygen is less than about 3 atomic percent.

Figure 5:
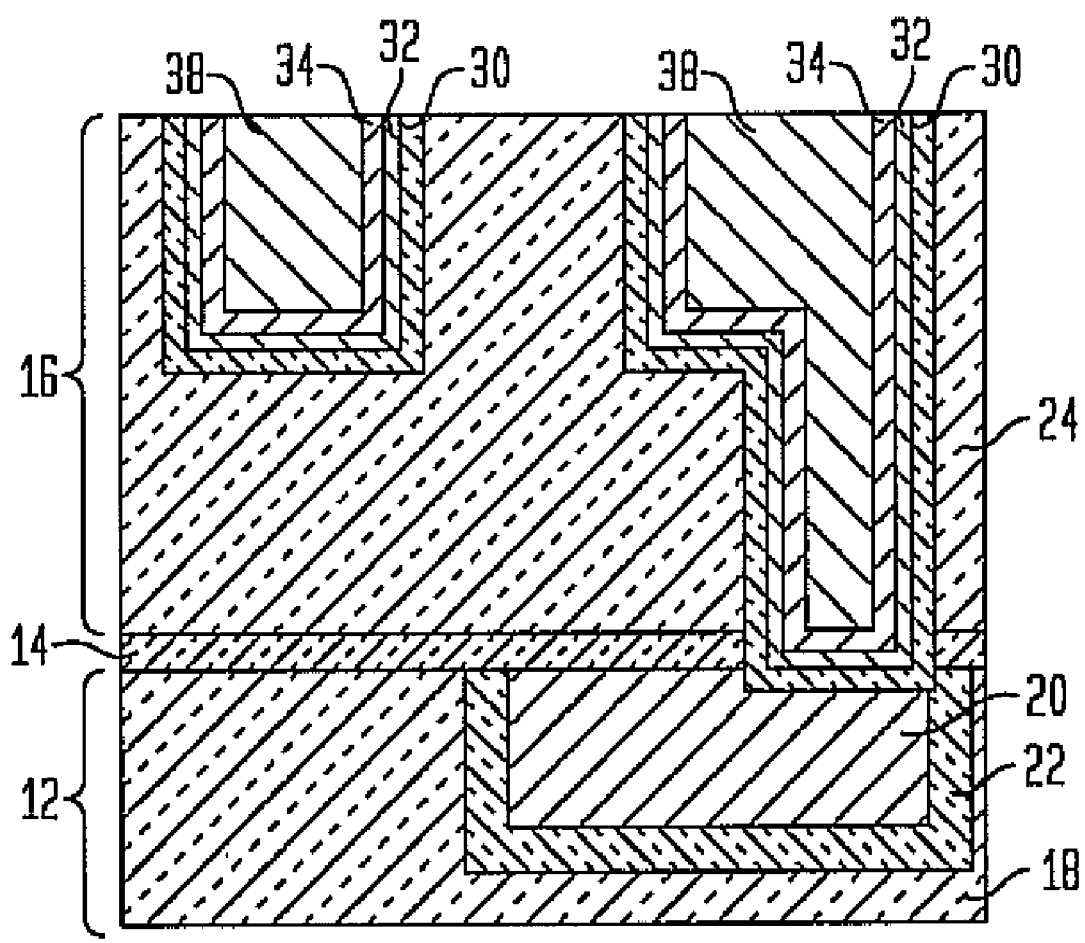
FIG. 5 is a pictorial representation (through a cross sectional view) illustrating the interconnect structure of FIG. 4 after formation of a conductive material within the at least one opening and subsequent planarization. In the illustrated structure, a closed-via bottom is illustrated on the right hand side.
Figure 6A:
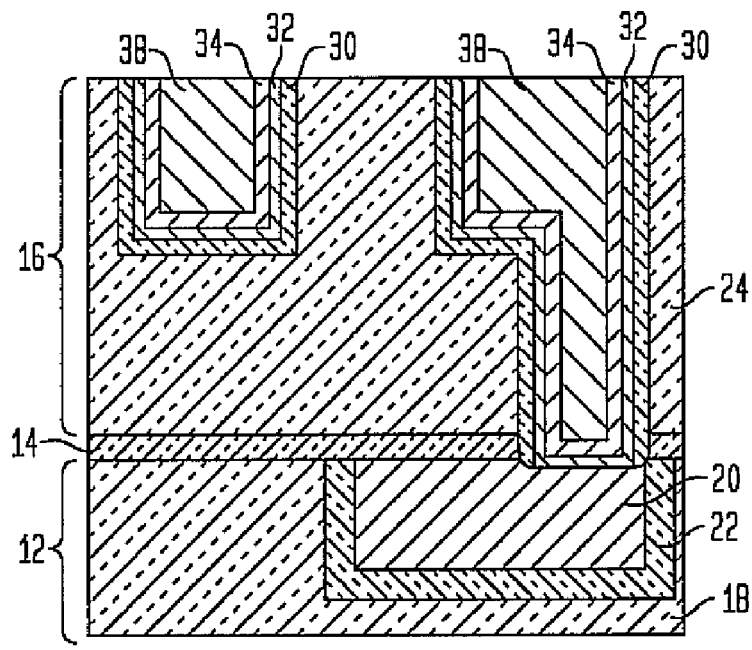
FIGS. 6A and 6B are pictorial representations (through cross sectional views) depicting alternative interconnect structure that can be formed utilizing the method of the present invention.
Figure 6B:
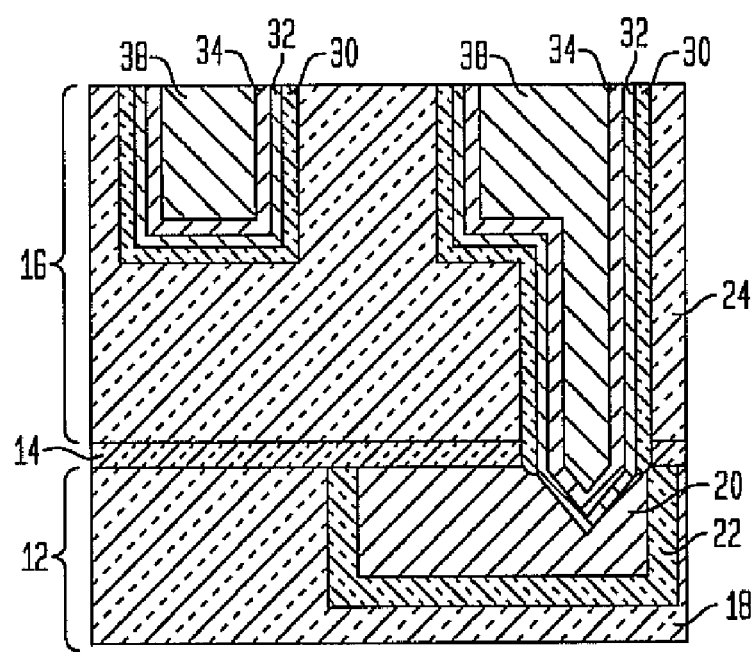

FIG. 5 shows the structure after forming an interconnect conductive material 38 within the at least one opening. The structure shown in FIG. 5 represents one possible embodiment of the present invention, while the structures shown in FIGS. 6A and 6B represent other possible embodiments of the present invention. In FIG. 5, a closed-via bottom structure is shown. In FIG. 6A, the interconnect conductive material 38 is formed within an open-via bottom structure. The open-via structure is formed by removing the diffusion barrier from the bottom of via 28A utilizing ion bombardment or another like directional etching process prior to deposition of the other elements. In FIG. 6B, an anchored-via bottom structure is shown. The anchored-via bottom structure is formed by first etching a recess into the conductive feature 20 utilizing a selective etching process. The diffusion barrier 30 is then formed and it is selectively removed from the bottom portion of the via and recess by utilizing one of the above-mentioned techniques. The other elements, i.e., oxidation-resistant noble metal seed layer (i.e., surface region 34 and layer 32) and conductive material 38, are then formed within the opening as described herein.

In each of the illustrated structures, the interconnect conductive material 38 may comprise the same or different, preferably the same, conductive material (with the proviso that the conductive material is not polysilicon) as that of the conductive feature 20. Preferably, Cu, Al, W or alloys thereof are used, with Cu or AlCu being most preferred. The conductive material 38 is formed utilizing the same deposition processing as described above in forming the conductive feature 20 and following deposition of the conductive material, the structure is subjected to planarization. The planarization process removes the diffusion barrier 30, the plating seed layer 32, oxidation-resistant noble metal seed layer 34, and conductive material 38 that is present above the upper horizontal surface of the upper interconnect level 16.

The method of the present application is applicable in forming such oxidation-resistant seed layer in any one or all of the interconnect levels of an interconnect structure. The same basic processing steps can be used to form other semiconductor structures, such as, for example, a field effect transistor, in which the oxidation-resistant metal seed layer is present.

The following example is provided to illustrate the broad concept of the present invention and to illustrate some advantages that are obtained therefrom.

EXAMPLE

Two copper-capped ruthenium films were analyzed by Secondary Ion Mass Spectrometry (SIMS), an analytical method to measure impurities such as carbon. One film was capped with copper without treatment (representative of the prior art); and the second was exposed to a $H_2$ plasma (representative of the present invention) before copper capping. The $H_2$ plasma treatment included a certain amount of $N_2$, e.g., from 0% to about 85%. Capping with a physical-vapor deposition copper film after a controlled time was done to seal any contaminants out of the ruthenium surface. So capped, the ruthenium and ruthenium surface would be representative of a fresh sample, i.e., representing the impurities of the film in the air-exposure time scale as such a film would be processed in a microelectronic manufacturing environment.

SIMS (secondary ion mass spectroscopy) shows that the plasma treatment significantly lowers the carbon content of the ruthenium film (in the bulk of the Ru as well as the film surface.). No change in hydrogen in the copper or in the ruthenium was observed. This shows no need to evaluate any effects of residual hydrogen. Also, only a slight change in the oxygen content of films were observed; one profile showed a slight lessening of signal at the top surface of the Ru. However, any lessening, or changing of bonding state from chemical reduction, may be a potential, and expected, benefit of the present invention, or may be a benefit for other film types. The above data clearly shows that the method of the present invention significantly cleans the ruthenium film. Getting rid of impurities such as carbon, particularly near the surface, is expected to improve the ability to plate films such as copper on the film; to improve consistency in a subsequent chemical-mechanical polish.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:

a dielectric material including at least one opening therein;

a diffusion barrier located within said at least one opening;

an oxidation-resistant noble metal seed layer located on said diffusion barrier, said oxidation-resistant noble metal seed layer comprises a noble metal seed layer having an upper surface region that is resistant to oxidation; and an interconnect conductive material located within the at least one opening atop said oxidation-resistant noble metal seed layer.

2. The interconnect structure of claim 1 wherein said dielectric material is one of $SiO_2$, a silsesquioxane, a C doped oxide that includes atoms of Si, C, O and H, and a thermosetting polyarylene ether.

3. The interconnect structure of claim 1 wherein said at least one opening is a line opening, a combined line opening and via opening, or combinations thereof.

4. The interconnect structure of claim 1 wherein said oxidation-resistant noble metal seed layer comprises a metal or metal alloy from Group VIIIA of the Periodic Table of Elements.

5. The interconnect structure of claim 4 wherein said oxidation-resistant noble metal seed layer comprises Ru, Ir, or Rh.

6. The interconnect structure of claim 1 wherein said upper surface region has a carbon content of about 2 atomic percent or less.

7. The interconnect structure of claim 1 wherein said upper surface region has a nitrogen content of about 3 atomic percent or less.

8. The interconnect structure of claim 1 wherein said diffusion barrier comprises Ta, TaN, Ti, TiN, Ru, RuN, RuTa, RuTaN, W, WN or any other material that can serve as a barrier to prevent conductive material from diffusing there through.

9. The interconnect structure of claim 1 wherein said interconnect conductive material is one of a conductive metal, an alloys comprising at least one conductive metal, and a conductive metal silicide.

10. The interconnect structure of claim 9 wherein said interconnect conductive material is a conductive metal selected from the group consisting of Cu, Al, W and AlCu.

11. The interconnect structure of claim 1 wherein said interconnect conductive material comprises Cu and said oxidation-resistant noble metal seed layer comprises Ru, Ir or Rh.

12. The interconnect structure of claim 1 wherein said interconnect conductive material is present in an open-via bottom structure, an anchored-via bottom structure, or a closed-bottom via structure.

13. A semiconductor structure comprising:

a film stack including an oxidation-resistant noble metal seed layer sandwiched between a substrate and a conductive metal-containing material, said oxidation-resistant noble metal seed layer comprises a noble metal seed layer having an upper surface region that is resistant to oxidation.

14. An interconnect structure comprising:

a dielectric material including at least one opening therein;

a diffusion barrier located within said at least one opening;

an oxidation-resistant noble metal seed layer located on said diffusion barrier, said oxidation-resistant noble seed layer has a surface region having a carbon content of about 2 atomic percent or less; and an interconnect conductive material located within the at least one opening atop said oxidation-resistant noble metal seed layer.

15. An interconnect structure comprising:

a dielectric material including at least one opening therein;

a diffusion barrier located within said at least one opening;

an oxidation-resistant noble metal seed layer located on said diffusion barrier, said oxidation-resistant noble seed layer has a surface region having a nitrogen content of about 3 atomic percent or less; and an interconnect conductive material located within the at least one opening atop said oxidation-resistant noble metal seed layer.

* * * * *